US012322890B2

(12) United States Patent
Cannon et al.

(10) Patent No.: US 12,322,890 B2
(45) Date of Patent: Jun. 3, 2025

(54) SYSTEMS AND METHODS FOR IMPROVING SAFETY ON ELECTRONIC DEVICE CONNECTIONS

(71) Applicant: Microsoft Technology Licensing, LLC, Redmond, WA (US)

(72) Inventors: Lawrence Dale Cannon, Bothell, WA (US); Michele Falcon, Redmond, WA (US); John Joseph Siegler, Carnation, WA (US); Shaun L. Harris, Redmond, WA (US); Brandon Aaron Rubenstein, Issaquah, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/915,317

(22) Filed: Jun. 29, 2020

(65) Prior Publication Data
US 2021/0408710 A1 Dec. 30, 2021

(51) Int. Cl.
*H01R 13/20* (2006.01)
*H05K 7/14* (2006.01)

(52) U.S. Cl.
CPC .......... *H01R 13/20* (2013.01); *H05K 7/1487* (2013.01)

(58) Field of Classification Search
CPC ............................. H01R 13/20; H05K 7/1467
See application file for complete search history.

(56) References Cited

U.S. PATENT DOCUMENTS

| | | | | |
|---|---|---|---|---|
| 2,130,424 A | * | 9/1938 | Grant | H01R 33/94 439/692 |
| 3,083,271 A | * | 3/1963 | Lambert | H01H 1/42 200/554 |
| 3,091,746 A | * | 5/1963 | Winkler | H01R 24/84 439/295 |
| 3,351,894 A | * | 11/1967 | Kinkaid | H01R 12/724 439/748 |
| 3,864,000 A | * | 2/1975 | Coller | H01R 12/737 439/246 |
| 3,923,361 A | * | 12/1975 | Rosen | H01R 12/82 439/264 |
| 3,979,615 A | * | 9/1976 | Neff | H01R 4/2445 310/71 |

(Continued)

FOREIGN PATENT DOCUMENTS

JP 2004158236 A 6/2004

OTHER PUBLICATIONS

"Invitation to Pay Additional Fees Issued in PCT Patent Application No. PCT/US2021/028038", Mailed Date: Jul. 14, 2021, 10 Pages.

(Continued)

*Primary Examiner* — Neil Abrams
(74) *Attorney, Agent, or Firm* — RAY QUINNEY & NEBEKER P.C.; Paul N. Taylor

(57) ABSTRACT

An electrical connector for transmitting electrical power includes at least one power pin with an ablative tip. The power pin has a body oriented in a direction of a longitudinal axis, and the ablative tip is at a terminal end along the longitudinal axis. The ablative tip includes a terminal edge and a support material positioned on a transverse side of the terminal edge that provides structural support to the terminal edge.

17 Claims, 7 Drawing Sheets

(56) References Cited

U.S. PATENT DOCUMENTS

| | | | | |
|---|---|---|---|---|
| 4,734,041 A * | 3/1988 | Bruchmann | H01R 12/82 | 439/924.1 |
| 4,743,210 A * | 5/1988 | Schild | H01R 13/74 | 439/562 |
| 4,747,783 A * | 5/1988 | Bellamy | H01R 13/03 | 200/268 |
| 4,826,443 A * | 5/1989 | Lockard | H01R 24/30 | 29/856 |
| 4,979,915 A * | 12/1990 | Pitts | H01R 13/04 | 439/884 |
| 5,023,752 A * | 6/1991 | Detter | B60R 16/0238 | 361/646 |
| 5,066,247 A * | 11/1991 | Watson | H01R 13/745 | 439/550 |
| 5,080,604 A * | 1/1992 | Rider | H01R 13/631 | 439/492 |
| 5,083,944 A * | 1/1992 | Self, Jr. | H01R 13/04 | 439/595 |
| 5,158,471 A * | 10/1992 | Fedder | H01R 12/58 | 439/947 |
| 5,211,585 A * | 5/1993 | Douty | H01R 13/64 | 439/248 |
| 5,445,541 A * | 8/1995 | May | H01R 13/04 | 439/595 |
| 5,513,995 A * | 5/1996 | Kurotori | H01R 24/52 | 439/564 |
| 5,582,519 A * | 12/1996 | Buchter | H01R 12/00 | 439/607.07 |
| 5,667,392 A * | 9/1997 | Kocher | H01R 12/724 | 439/79 |
| 6,146,211 A * | 11/2000 | Okamoto | H01R 13/44 | 439/825 |
| 6,168,477 B1 * | 1/2001 | Shih | H01R 12/716 | 439/79 |
| 6,358,100 B1 * | 3/2002 | Watanabe | H01R 13/41 | 439/733.1 |
| 6,402,566 B1 * | 6/2002 | Middlehurst | H01R 13/113 | 439/680 |
| 6,411,526 B1 * | 6/2002 | Nguyen | H01R 13/518 | 439/954 |
| 6,471,523 B1 * | 10/2002 | Shuey | H01R 13/112 | 439/63 |
| 6,488,549 B1 * | 12/2002 | Weller | H01R 13/6485 | 439/856 |
| 6,749,470 B2 * | 6/2004 | Dangelmaier | H01R 13/193 | 439/857 |
| 6,776,637 B2 * | 8/2004 | Yamada | H01R 13/74 | 439/247 |
| 6,848,950 B2 * | 2/2005 | Allison | H01R 12/7088 | 439/907 |
| 6,918,800 B2 * | 7/2005 | Ota | H01R 13/03 | 439/181 |
| 7,229,321 B2 * | 6/2007 | Hegel | H01R 13/112 | 439/637 |
| 7,341,484 B2 * | 3/2008 | Yamamoto | H01R 13/5202 | 439/271 |
| 7,365,964 B2 * | 4/2008 | Donahue, IV | H01R 13/514 | 361/622 |
| 7,431,600 B2 * | 10/2008 | Kozak | H01R 24/64 | 439/924.1 |
| 7,578,699 B2 * | 8/2009 | Yin | G06F 1/181 | 439/544 |
| 7,597,573 B2 * | 10/2009 | Defibaugh | H01R 13/46 | 439/206 |
| 7,604,489 B2 * | 10/2009 | Shuey | H01R 12/716 | 439/845 |
| 7,806,738 B2 * | 10/2010 | Wu | H01R 13/113 | 439/860 |
| 7,928,825 B2 * | 4/2011 | Yang | H01R 13/7137 | 439/604 |
| 8,096,843 B2 * | 1/2012 | Gong | H01R 12/727 | 439/856 |
| 8,545,275 B2 * | 10/2013 | Wang | H01R 24/22 | 439/732 |
| 8,613,626 B1 * | 12/2013 | Phan | H01R 13/11 | 439/268 |
| 8,740,632 B2 * | 6/2014 | Osawa | H01R 13/50 | 439/76.2 |
| 8,932,082 B2 * | 1/2015 | Yu | H01R 12/724 | 439/79 |
| 9,059,534 B2 * | 6/2015 | Endo | H01R 13/5205 | |
| 9,312,650 B1 * | 4/2016 | Chen | H01R 12/724 | |
| 9,318,849 B2 * | 4/2016 | Kobayashi | H01R 13/5216 | |
| 9,331,413 B2 * | 5/2016 | Trujillo | H01R 13/04 | |
| 9,419,356 B2 * | 8/2016 | Copper | H01R 12/7076 | |
| 9,490,561 B2 * | 11/2016 | Brusco | H01R 13/035 | |
| 9,601,864 B2 * | 3/2017 | Schmidt | H01R 13/5202 | |
| 9,733,682 B2 * | 8/2017 | Butzer | H05K 7/1492 | |
| 10,505,312 B2 * | 12/2019 | Johannes | H01R 13/20 | |
| 10,879,645 B2 * | 12/2020 | Zhang | H01R 13/748 | |
| 11,095,056 B2 * | 8/2021 | Hung | H01R 13/629 | |
| 2010/0041266 A1 * | 2/2010 | Data | H01R 13/629 | 439/358 |
| 2015/0177797 A1 | 6/2015 | Butzer et al. | | |
| 2021/0408710 A1 * | 12/2021 | Cannon | H01R 31/06 | |

OTHER PUBLICATIONS

"International Search Report and Written Opinion Issued in PCT Application No. PCT/US21/028038", Mailed Date: Sep. 6, 2021, 15 Pages.

Communication pursuant to Article 94(3) EPC, Received for European Application No. 21724454.0, mailed on Feb. 13, 2025, 05 pages.

\* cited by examiner

SYSTEMS AND METHODS FOR IMPROVING SAFETY ON ELECTRONIC DEVICE CONNECTIONS

BACKGROUND

Background and Relevant Art

Racks for electronic devices, such as server racks with blade servers, support and provide electrical connections for the electronic devices. The electrical connections provide power to the electronic devices. Conventional connectors between the electronic devices and the power distribution unit of the rack can become damaged. When the connectors become damaged, removal of the electronic device from the rack can pull a protective covering from the power distribution unit, leaving high-power contacts exposed and creating a risk of shock or fire.

BRIEF SUMMARY

In some embodiments, an electrical connector for transmitting electrical power includes at least one power pin with an ablative tip. The power pin has a body oriented in a direction of a longitudinal axis, and the ablative tip is at a terminal end along the longitudinal axis. The ablative tip includes a terminal edge and a support material positioned on a transverse side of the terminal edge that provides structural support to the terminal edge.

In some embodiments, an electrical connector for transmitting electrical power includes a plurality of receiving contacts and an electrically insulating connector body. The plurality of receiving contacts is configured to provide electrical power to power pins. The connector body includes a plurality of ports positioned in the connector body from a front surface of the connector body to a back surface of the connector body, and the plurality of ports includes the plurality of receiving contacts. The connector body further includes a skirt positioned proximate the back surface of the connector body and projecting laterally from the connector body. The skirt has a forward-facing contact surface that projects laterally beyond the body of the connector body.

In some embodiments, an electrical connector system for transmitting electrical power includes a male connector and a female connector. The male connector includes at least one power pin with an ablative tip. The power pin has a body oriented in a direction of a longitudinal axis, and the ablative tip is at a terminal end along the longitudinal axis. The ablative tip includes a terminal edge and a support material positioned on a transverse side of the terminal edge that provides structural support to the terminal edge. The female connector includes a plurality of receiving contacts and an electrically insulating connector body. The plurality of receiving contacts is configured to provide electrical power to power pins. The connector body includes a plurality of ports positioned in the connector body from a front surface of the connector body to a back surface of the connector body, and the plurality of ports includes the plurality of receiving contacts. The connector body further includes a skirt positioned proximate the back surface of the connector body and projecting laterally from the connector body. The skirt has a forward-facing contact surface that projects laterally beyond the body of the connector body.

This Summary is provided to introduce a selection of concepts in a simplified form that are further described below in the Detailed Description. This Summary is not intended to identify key features or essential features of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 2-1 is a perspective view of a conventional power pin and ablative tip;

FIG. 2-2 is a perspective view of a damaged conventional power pin and ablative tip;

FIG. 3-1 is a front view of a connector body, according to at least some embodiments of the present disclosure;

FIG. 3-2 is a rear view of the connector body of FIG. 3-1, according to at least some embodiments of the present disclosure;

FIG. 5-1 is a perspective view of a connector body with a perimeter skirt, according to at least some embodiments of the present disclosure;

FIG. 5-2 is a side cross-section view of the connector body of FIG. 5-1 in an opening of a power distribution unit, according to at least some embodiments of the present disclosure;

FIG. 6-1 is a perspective view of a male connector with supported ablative tips, according to at least some embodiments of the present disclosure;

FIG. 6-2 is a perspective view of a damaged male connector of FIG. 6-1, according to at least some embodiments of the present disclosure;

DETAILED DESCRIPTION

Figure 1:
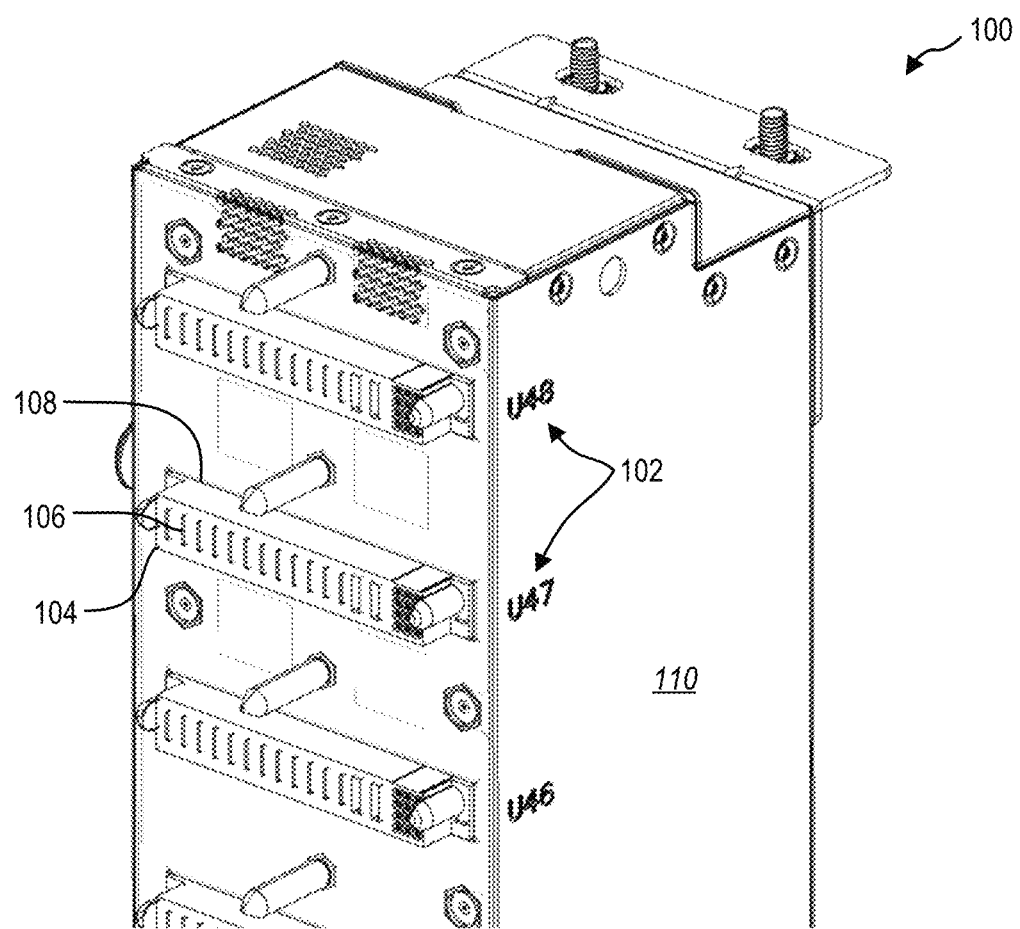
FIG. 1 is a perspective view of a power distribution unit, according to at least some embodiments of the present disclosure.

The present disclosure relates generally to systems and methods for a connection for transmitting electrical power. More particularly, the present disclosure relates to systems and methods of providing a safer electrical connection on blind mating connections for computing devices. Connectors according to the present disclosure may include one or more safety features that reduce the risk of user injury or death and/or facility damage due to the high electrical currents and high electrical potential carried by the connectors.

Data centers use racks to hold a plurality of and variety of computing devices in a relatively compact environment. A rack, such as a server rack, includes a power distribution unit (PDU) to provide electrical power to a plurality of electronic or computing devices connected to the PDU. In some embodiments, a PDU can provide dozens of kilowatts (kW) of electrical power, with some examples providing 17 kW or 34 kW. A PDU includes a plurality of connectors that each include a plurality of receiving contacts that allow electrical communication to the connected devices.

Due to the relatively large amounts of power distributed by the PDU, electrical arcing can occur as an electrical contact is connected or disconnected. Some electrical connectors have ablative tips. Ablation tips are a sacrificial portion of a pin of the power connector. The ablation tip experiences the arcing, if any, from the female connector (e.g., female version of the electrical connector) of the PDU. The ablation tip is conventionally a blunt-tipped extension from the terminal end of a body of the power pin. The ablation tip is conventionally a square-shaped extension from the square-shaped body of the power pin. If arcing occurs, the ablation tip can erode, and the power pin can still function without losing its integrity.

In some instances, the ablation tip can be bent during handling of the electronic device with the power pins. When the electronic device is mated with a female connector of the PDU or other connection, the chamfered lead-in surfaces on connector body of the female connectors bend the tabs up to 180°, forming them into hooks. A hook can potentially be inserted into the female connector during the connection process. In instances when an electronic device with a damaged ablation tip gets pulled away from the female connector in the PDU, the hook formed by the damaged ablation tip can pull the plastic connector body off of the female connector, leaving live contacts exposed, which is a safety risk to technicians and to the equipment and facility.

In some embodiments according to the present disclosure, an ablation tip includes support material on either transverse side of the sacrificial terminal edge. The support material provides structural support to the sacrificial portion. In some embodiments, the structural support can prevent the bending of the ablation tip into a hook. In some embodiments, the structural support can cause the power pin to bend in the body of the power pin instead of the ablation tip. When the power pin bends in the body of the pin, the power pin will no longer align with the receiving contacts of the female connector and prevent insertion of the damaged male connector (e.g., male version of the electrical connector). The damaged male connector can then be identified and repaired or replaced prior to insertion.

In some embodiments, a female connector according to the present disclosure includes one or more retention mechanisms to limit and/or prevent the unintended removal of a connector body when a hook is inserted into the female connector. For example, the connector body can include a skirt positioned at an edge and projecting laterally from the edge. The skirt may provide one or more forward-facing contact surfaces that contacts and applies a force to an inner surface of the PDU housing. The PDU housing can then support the connector body against the pulling force caused by the hook upon a technician removing the connected electronic device.

In some embodiments, a server rack, storage rack, power supply unit (PSU) rack, or other rack of electronic devices includes a PDU mounted to a frame of the rack. The PDU includes a plurality of female connectors that align with shelves, rails, or other support mechanisms of the rack that support electronic devices in the rack. In some embodiments, the PDU includes 10, 20, 30, 40, or more female connectors. In some embodiments, all of the female connectors may be connected to electronic devices, or less than all of the female connectors may be connected to electronic devices. In some embodiments, a connection system includes any male connector with supported ablative tips and any female connector with a skirt according to the present disclosure.

FIG. 1 is a perspective view of an embodiment of a PDU 100 with a plurality of female connectors 102. The female connectors 102 each have a connector body 104 with a plurality of ports 106 therein to receive power pins from a male connector. The connector body 104 is located in an opening 108 of the PDU housing 110. In some embodiments, at least a portion of the connector body 104 protrudes from the PDU housing 110. The ports 106 contain contacts to provide an electrical connection with the male connector.

In some embodiments, the female connectors provide electrical power to the electronic devices. The female connectors may also provide data communication to the electronic devices. For example, a female connector may have a plurality of receiving contacts configured to receive power pins from a male connector and a plurality of data contacts that are configured to receive data pins from the male connector. In some embodiments, the receiving contacts of the female connector provide at least 10 A of electrical current. In some embodiments, the receiving contacts of the female connector provide at least 20 A of electrical current. In some embodiments, the receiving contacts of the female connector provide at least 30 A of electrical current. In some embodiments, the receiving contacts of the female connector provide at least 120 V of electrical potential. In some embodiments, the receiving contacts of the female connector provide at 240 V of electrical potential. In some embodiments, the receiving contacts of the female connector provide at 400 V of electrical potential.

The receiving contacts of the female connector are protected by and spaced apart by a connector body. The connector body has a plurality of ports positioned therein, and each receiving contact of the plurality of receiving contacts is located in a port, respectively. The receiving contacts are insulated from one another by the insulating material of the connector body. In some embodiments, the connector body is plastic, such as nylon. The connector body provides protection from electrical shorts that may cause fires or other damage, and the connector body provides protection from dangerous electrical shocks to a user.

The connector body is positioned in an opening of the PDU housing. Some connector bodies for female connectors are positioned in the opening of the PDU housing by a press fit or friction fit. The connector body can be pulled from the opening and away from the housing by a force that overcomes the friction between the connector body and the housing. In some embodiments according to the present disclosure, a connector body has one or more retention mechanisms that limit or prevent the movement of the connector body away from the housing.

A male connector may connect to the female connector. A conventional male connector has a plurality of power pins protruding therefrom that have sacrificial ablative tips. The ablative tips are tabs that protrude from a terminal end of the power pin. The ablative tip is positioned in the transverse center of the terminal end to receive arcing from a receiving contact. The tab-like ablative tip, however, is prone to damage upon impacts. An impact that applies a lateral force to the ablative tip can bend the ablative tip to the side. In some embodiments, an impact that applies longitudinal force can result in column bending, bending the ablative tip to the side.

Figures 1, 2:
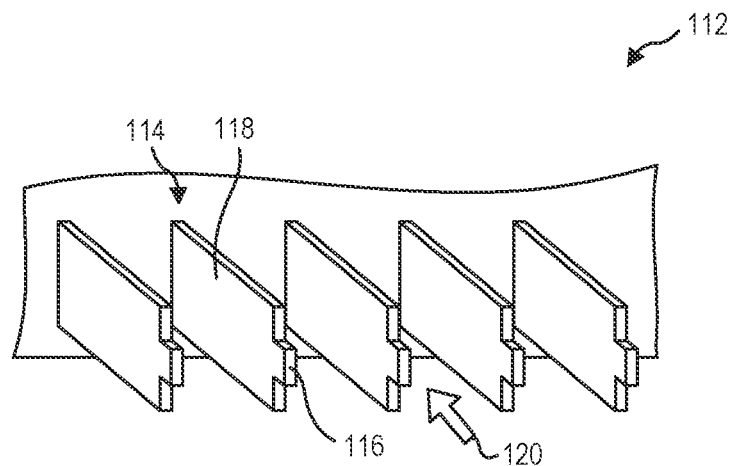
Figure 2:
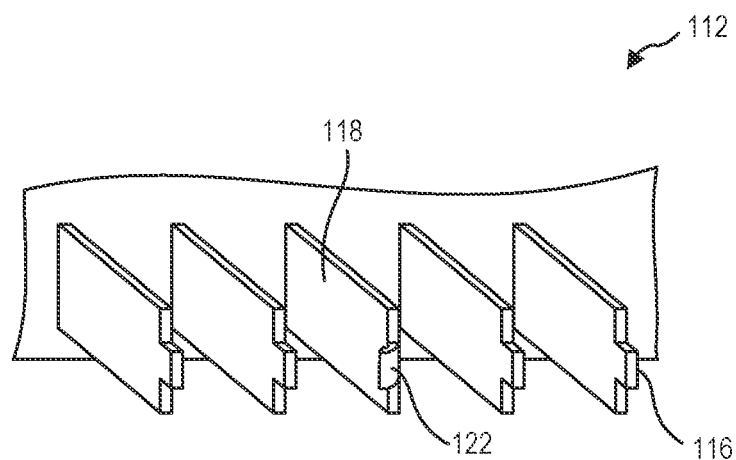

FIG. 2-1 is a perspective view of an embodiment of male connector 112 that connects to a female connector such as the female connector 102 of FIG. 1. The male connector 112 has a plurality of power pins 114 with unsupported ablative tips 116. The unsupported ablative tips 116 protrude from a terminal end of the power pins 114 and may be exposed to impacts or other forces during transport, storage, or usage. Because the unsupported ablative tips 116 are smaller in a vertical direction than the power pin body 118, an impact 120 is more likely to bend the unsupported ablative tips 116 than the power pin body 118. Once bent out of alignment with the power pin body 118, the unsupported ablative tip 116 is at increased risk of further bending or damage.

In some examples, a damaged ablative tip can be further damaged by inserting the damaged ablative tip into a female connector, such as described herein. The resulting damaged ablative tip can form a hook that can engage with and pull off the friction-fit connected connector body. FIG. 2-2 is a perspective view of the embodiment of a male connector 112 with unsupported ablative tips 116 of FIG. 2-1 after at least one of the unsupported ablative tips 116 is bent into a hook 122. The hook 122 being oriented out of plane with the power pin body 118 can engage with a connector body.

In some embodiments, a connector body according to the present disclosure has a plurality of ports positioned in and through the connector body. Each of the ports extends through the connector body from a front surface to a back surface. Each port has a receiving contact positioned therein to physically contact and create an electrical connection with a power pin of the male connector.

Figures 1, 3:
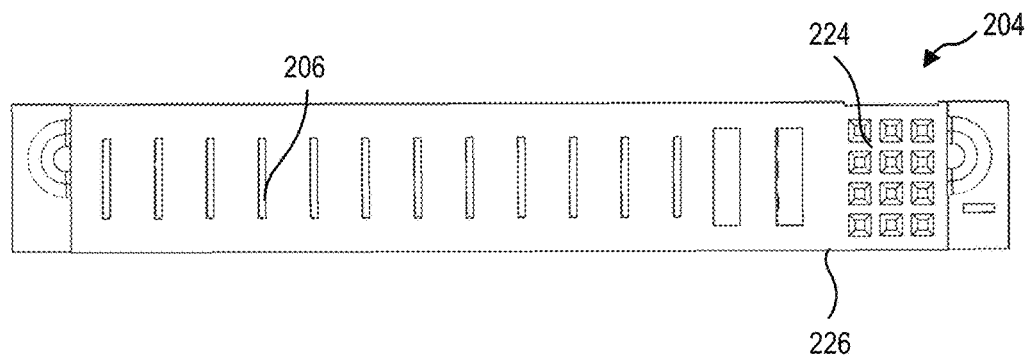
Figures 2, 3:
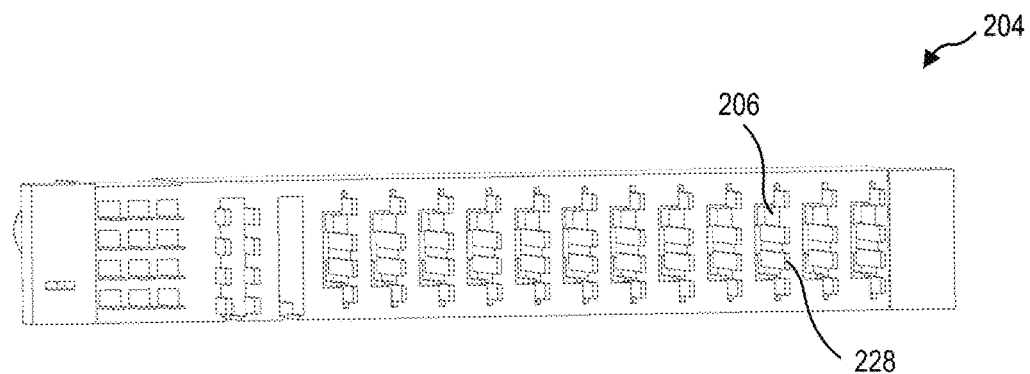

FIG. 3-1 is a front view of an embodiment of a connector body 204 with a plurality of ports 206 therein. The connector body 204 also includes data ports 224 that receive data pins from the male connector. The connector body 204 body is sized to fit within and be inserted into an opening of a PDU housing (such as the opening 108 in the PDU housing 110 of FIG. 1), and the connector body 204 may be retained via a friction fit.

In some embodiments, a hooked ablative tip or otherwise damaged ablative tip can be inserted into the port and engage with a sidewall of the port or engage with the back surface of the connector body. Pulling on the male connector can then apply a pulling force to the connector body. As the connector body is conventionally formed of plastic or another elastically deformable material, pulling on the connector body can bow the connector body, releasing the connector body from contact with the lateral sides of the opening in the PDU housing and reducing or removing the friction force holding the connector body in place. In other examples, the connector body is formed of a rigid material, and the pulling force overcomes the friction force holding the connector body in place, exposing the contacts behind the connector body.

In some embodiments, the female connector is made by inserting pins into the connector body while the connector body is being molded. Pulling the connector body free of the contacts requires breaking the friction bond between the body and the contacts. This connector style is a "press-in". In order to secure it to a printed circuit board (PCB), the contact pins on the backside of the connector are pressed into pre-drilled and plated holes in the PCB. The force required to pull the connector body free of the contacts is less than the friction force the contacts have with the PCB. In some conventional systems, the connector body is retained in the housing by the friction force with the PCB and the housing provides no retention to the female connector.

FIG. 3-2 is a back view of the connector body 204 of FIG. 3-1. The back of the ports 206 have receiving contacts 228 therein that contact and provide electrical power from the PDU or other power source. When the connector body 204 is removed from the PDU (e.g., pulled out by a hook on a male connector), the contact from the power source are exposed and present a danger.

A connector body according to the present disclosure has, in some embodiments, at least one forward-facing contact surface that is positioned on a perimeter edge of the connector body and is outside the opening. The contact surface, therefore, applies a compressive force to an inner surface of the PDU housing and resists outward movement and/or pull-out of the connector body.

Figure 4:
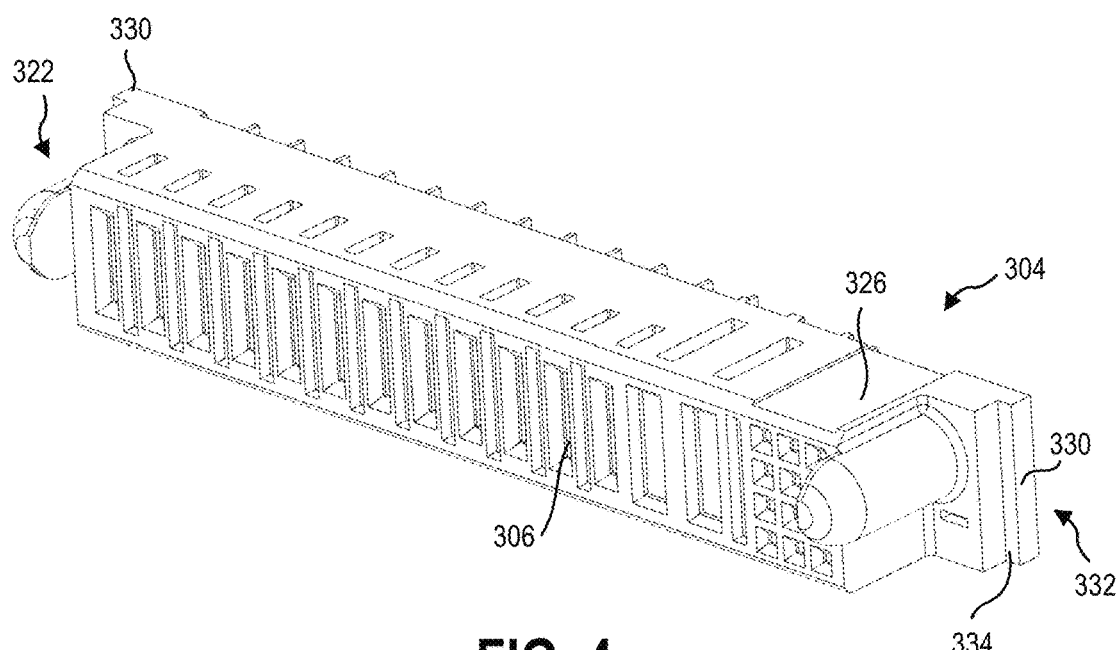
FIG. 4 is a perspective view of a connector body with side skirts, according to at least some embodiments of the present disclosure.

In some embodiments, the skirt is positioned on a portion of the perimeter edge of the connector body. In some embodiments, the skirt is positioned on the lateral ends of the connector body. As the connector bodies are stacked in the PDU housing, adding the skirts to the lateral ends of the connector body may allow embodiments of a connector body according to the present disclosure to be used with existing standardized PDU housings. For example, FIG. 4 is a perspective view of an embodiment of a connector body 304 according to the present disclosure. The connector body 304 has ports 306 therein to complementarily mate with a male connector. The connector body 326 has skirts 330 positioned on either lateral side 332 with forward-facing contact surfaces 334.

Figures 1, 5:
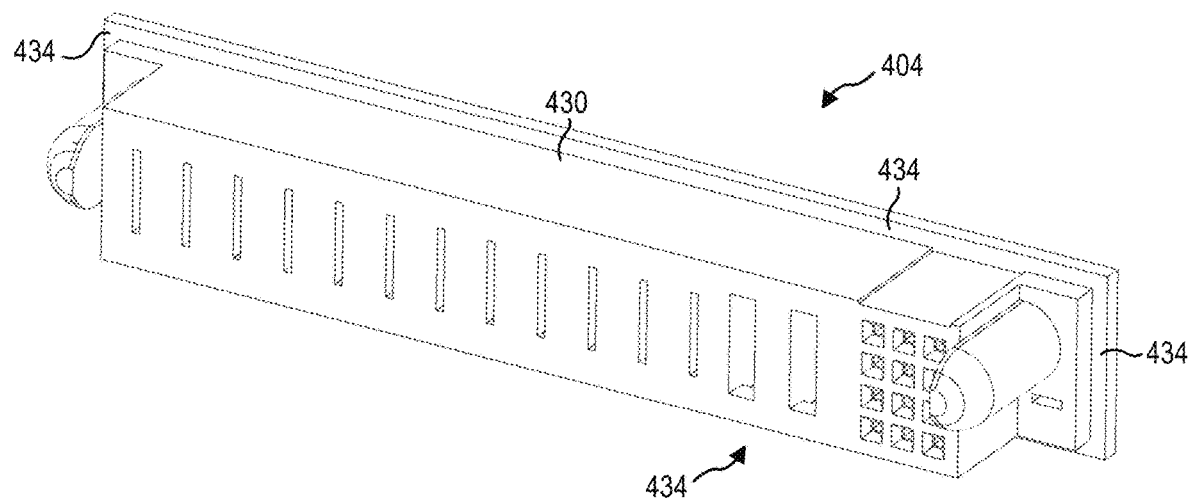
Figures 2, 5:
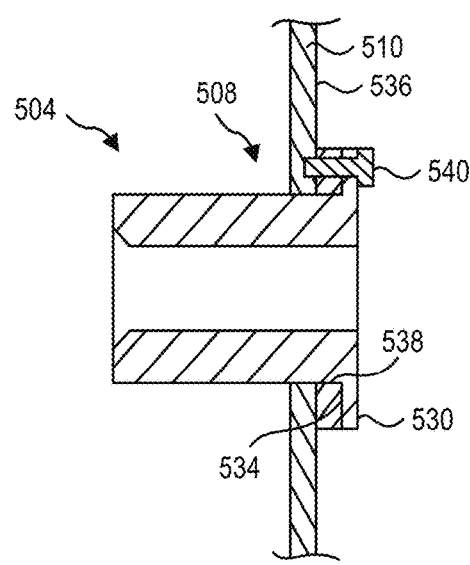

The skirt may be positioned along a top edge and/or a bottom edge of the connector body. As some embodiments of a connector body are prone to deformation (e.g., bowing), forward-facing contact surfaces on the top and bottom of the connector body, where the contact surfaces are closer together, may allow for less deformation under a pulling force on the connector body. As shown in FIG. 5-1, in at least one embodiment, a connector body 404 has a skirt 430 and a forward-facing contact surface 434 that is located around the entire perimeter edge of the connector body 426. FIG. 5-2 is a side cross-sectional view of the connector body 404 of FIG. 5-1 with the forward-facing contact surface 434 positioned proximate an inner surface 536 of the PDU housing 510 around the entire edge of the opening 508 in the PDU housing 510.

In some embodiments, the skirt 530 can allow for additional retention mechanisms to be applied to and/or between the connector body 504 and the PDU housing 510. For example, the contact surface 534 of the connector body 504 provides a compression surface for the application of an adhesive 538 that can supplement the retention of the connector body 504 in the opening 508. In other examples, the skirt 530 can provide space for a mechanical fastener 540 to fasten the connector body 504 to the PDU housing 510. Mechanical fasteners 540 can include clips, clamps, pins, screws, bolts, nuts, rods, rivets, or other fasteners that apply a compression force to hold the components together.

In some embodiments, the amount and/or likelihood of a pulling force being applied to the connector body can be reduced by using embodiments of a male connector according to the present disclosure. In some embodiments, the male connector includes at least one power pin. The power pin is configured to insert into the port of a connector body and connect with a receiving contact. Due the chances of arcing, a power pin according to the present disclosure includes an ablative tip with a terminal edge that is positioned longitudinally protruding from a body of the power pin.

Figures 1, 6:
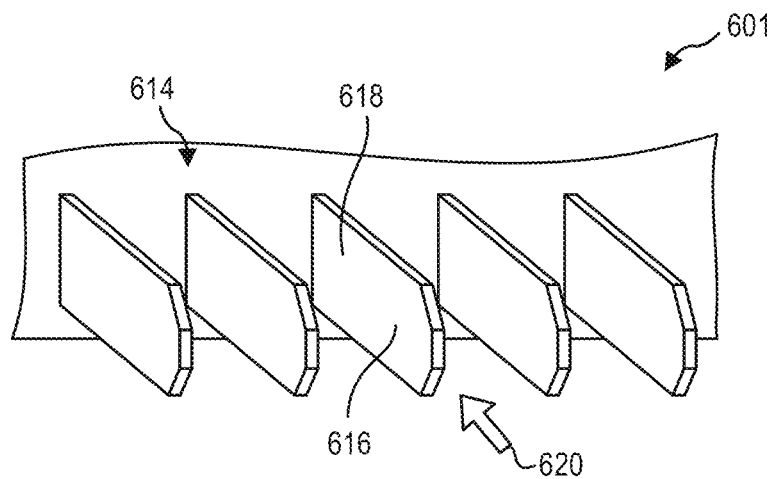
Figures 2, 6:
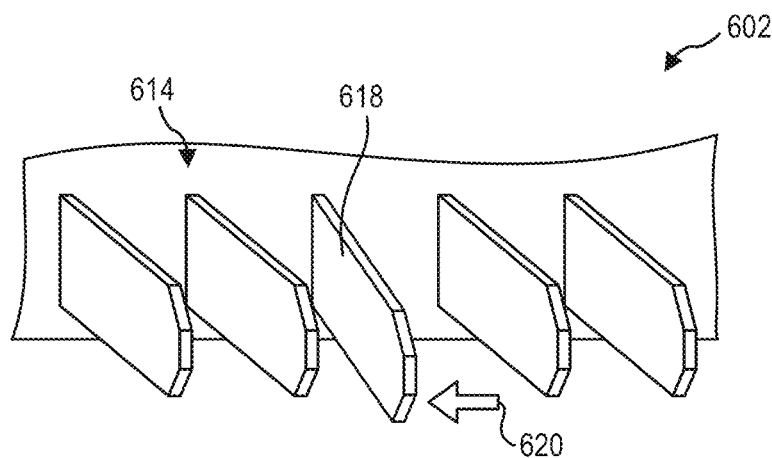
Figure 10:
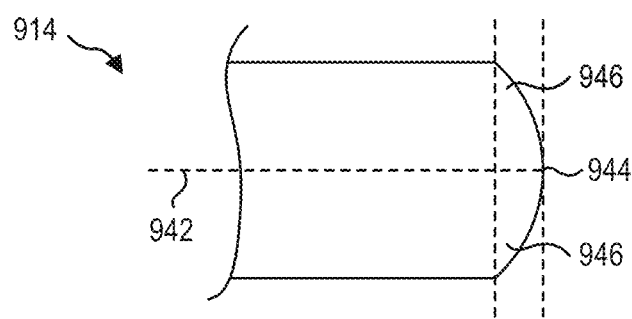
FIG. 10 is a side view of a power pin with a partially curved ablative tip, according to at least some embodiments of the present disclosure.

FIG. 6-1 through FIG. 10 illustrate various embodiments of a male connector with supported ablative tips. Any embodiment of a male connector with supported ablative tips may be used in conjunction with any female connector described herein, such as, but not limited to those described in relation to FIGS. 4 and 5.

FIGS. 6-1 and 6-2 illustrate an embodiment of a male connector 612 with a plurality of power pins 614 with ablative tips 616 according to the present disclosure. The ablative tip 616 according to the present disclosure has a greater horizontal strength to resist lateral bending, relative to a conventional ablative tip of the same material. In some embodiments, the ablative tip 616 has a greater lateral bending strength than a portion of the body 618 of the power pin 614, resulting in the body 618 of the power pin 614 bending in response to an applied lateral force 620. The bent body 618 of the power pin 614, as shown in FIG. 6-2 may prevent insertion of the damaged male connector 602 and can prevent a dangerous or damaging situation.

Figure 7:
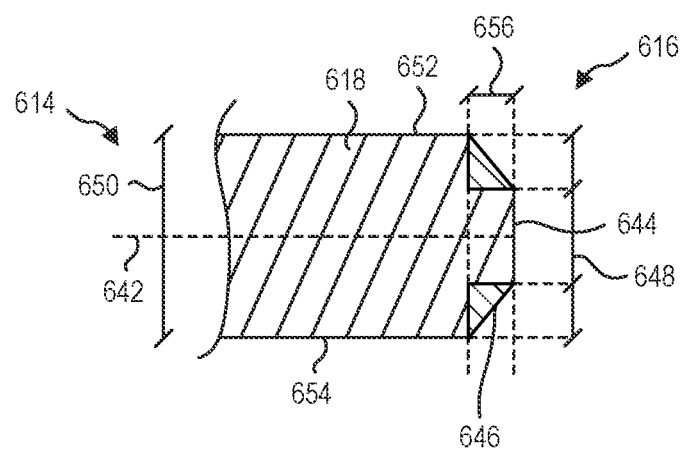
FIG. 7 is a side cross-sectional view of a power pin, according to at least some embodiments of the present disclosure.

FIG. 7 is a longitudinal cross-sectional view of an embodiment of a power pin 614 with a supported ablative tip 616. The power pin 614 includes a body 618 oriented along a longitudinal axis 642 with an ablative tip 616 at a terminal end of the body 618. The ablative tip 616 has a terminal edge 644 at or near a vertical center of the ablative tip 616 with support material 646 on at least one vertical side (e.g., above and/or below) the terminal edge 644. In some embodiments, the support material 646 is integral with the power pin material. In some embodiments, the support material 646 is a second material that provides support to the terminal edge 644 of the ablative tip 616 but is discrete from the power pin material. For example, support material 646 may be injection molded around the ablative tip to support a conventional unsupported ablative tip.

In some embodiments, the ablative tip 616 has a terminal edge 644 that is perpendicular to the longitudinal axis 642. In some embodiments, the ablative tip 616 is trapezoidal in longitudinal cross-section. The terminal edge 644 may be positioned proximate the vertical center of the terminal end and have a tip height 648 that is a percentage of the pin height 650 of the power pin 614. In some embodiments, the tip height 648 is a percentage of the pin height 650 in a range having an upper value, a lower value, or upper and lower values including any of 20%, 30%, 40%, 50%, 60%, 70%, 75%, or any values therebetween. In some examples, the tip height 648 is greater than 20% of the pin height 650. In some examples, the tip height 648 is less than 75% of the pin height 650. In other examples, the tip height 648 is between 20% and 75% of the pin height 650. In yet other examples, the tip height 648 is between 30% and 50% of the pin height 650. In at least one example, the tip height 648 is about 33% of the pin height 650.

In some embodiments, the support material 646 is symmetrical on either side of the terminal edge 644. In other embodiments, the support material 646 is asymmetrical. In some embodiments, the support material 646 spans the height of the pin 614 between the terminal edge 644 and the top and bottom edges 652, 654 of the pin body 618. For example, when the tip height 648 is 33% of the pin height 650, the support material 646 may be positioned in the 33% of the pin height 650 above the terminal edge 644 and in the 33% of the pin height 650 below the terminal edge 644. In some embodiments, when the tip height 648 is 33% of the pin height 650, the support material 646 may be positioned in 17% of the pin height 650 above the terminal edge 644 and in the 50% of the pin height 650 below the terminal edge 644.

The ablative tip 616 has a tip length 656 in the longitudinal direction of the power pin 614 relative to the pin height 650. In some embodiments, the tip length 656 is a percentage of the pin height 650 in a range having an upper value, a lower value, or upper and lower values including any of 20%, 30%, 40%, 50%, 60%, 70%, 75%, or any values therebetween. In some examples, the tip length 656 is greater than 20% of the pin height 650. In some examples, the tip length 656 is less than 75% of the pin height 650. In other examples, the tip length 656 is between 20% and 75% of the pin height 650. In yet other examples, the tip length 656 is between 30% and 50% of the pin height 650. In at least one example, the tip length 656 is about 33% of the pin height 650.

Figure 8:
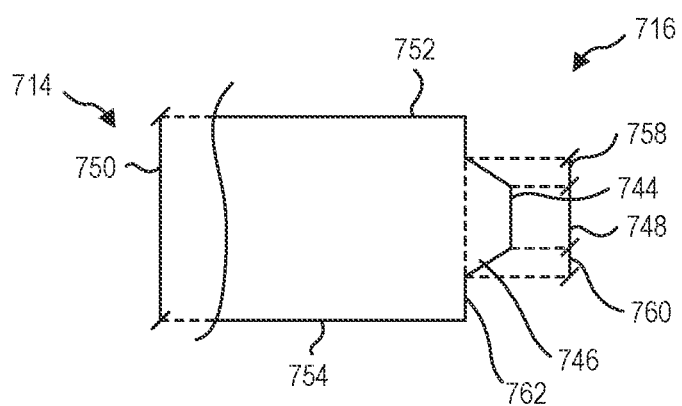
FIG. 8 is a side view of another power pin, according to at least some embodiments of the present disclosure.

FIG. 8 is a side view another embodiment of a power pin 714 according to the present disclosure. In some embodiments, the support material 746 does not connect between the terminal edge 744 and the top and/or bottom edge 752, 754 of the pin body 718. For example, a terminal edge 744 may have a tip height 748 that is 33% of the pin height 750, while the support material 746 above the terminal edge 744 may have a first support height 758 that is 15% of the pin height 750 and the support material 746 below the terminal edge 744 may have a second support height 760 that is 15% of the pin height 750. The support material 746 may sufficiently support the ablative tip 716 while leaving a shoulder 762 on the pin body 718.

Figure 9:
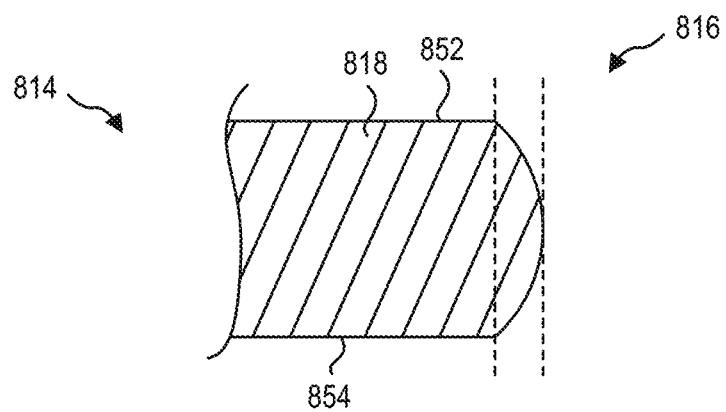
FIG. 9 is a side cross-sectional view of a power pin with a curved ablative tip, according to at least some embodiments of the present disclosure.

Some embodiments of an ablative tip include a curved portion or any entirely curved ablative tip. In some examples, the ablative tip has a continuously curving terminal end in longitudinal cross-section. In some examples, the ablative tip has a constant radius of curvature. FIG. 9 is a longitudinal cross-sectional view of an embodiment of a power pin 814 with a curved ablative tip 816. The curved ablative tip 816 of FIG. 9 has a constant radius of curvature from the top edge 852 to the bottom edge 854 of the pin body 818.

In other examples, the ablative tip has an exponential radius of curvature, such as a parabolic curvature or hyperbolic curvature. In some embodiments, the curved terminal end of the power pin that forms the ablative tip spans the pin height from the top edge of the power pin to the bottom edge of the power pin. In some embodiments, the curved terminal end has a height that is less than the pin height. In at least one embodiment, the terminal edge is curved with angled support material above and/or below the curved terminal edge. FIG. 10 is a side view of an embodiment of a power pin 914 where the terminal edge 944 is perpendicular to the longitudinal axis 942 with curved support material 946 above and/or below the straight terminal edge 944.

INDUSTRIAL APPLICABILITY

The present disclosure relates generally to systems and methods for providing a connection for transmitting electrical power. More particularly, the present disclosure relates to systems and methods of providing a safer electrical connection on blind mating connections for computing devices. Connectors according to the present disclosure may include one or more safety features that reduce the risk of user injury and/or facility damage due to the high electrical currents and high electrical potential carried by the connectors.

Data centers use racks to hold a plurality of and variety of computing devices in a relatively compact environment. A rack, such as a server rack, includes a power distribution unit (PDU) to provide electrical power to a plurality of electronic or computing devices connected to the PDU. In some embodiments, a PDU can provide dozens of kilowatts (kW) of electrical power, with some examples providing 17 kW or 34 kW. A PDU includes a plurality of connectors that each include a plurality of receiving contacts that allow electrical communication to the connected devices.

Due to the relatively large amounts of power distributed by the PDU, electrical arcing can occur as an electrical contact is connected or disconnected. Some electrical connectors have ablative tips. Ablation tips are a sacrificial portion of a pin of the power delivery connector. The ablation tip experiences the arcing, if any, from the female connector of the PDU. The ablation tip is conventionally a blunt-tipped extension from the terminal end of a body of the power pin. The ablation tip is conventionally a square-shaped extension from the square-shaped body of the power pin. If arcing occurs, the ablation tip can erode, and the power pin can still function without losing its integrity.

In some instances, ablation tip can be bent during handling of the electronic device with the power pins. When the electronic device is mated with a female connector of the PDU or other connection, the chamfered lead in surfaces on connector body of the female connectors bend the tabs over 90° or more, forming them into hooks. A hook can potentially be inserted into the female connector during the connection process. In instances when an electronic device with a damaged ablation tip gets pulled away from the female connector in the PDU, the hook formed by the damaged ablation tip can pull the plastic connector body off of the female connector, leaving live contacts exposed, which is a safety risk to technicians and to the equipment and facility.

In some embodiments according to the present disclosure, an ablation tip includes support material on either transverse side of the sacrificial terminal edge. The support material provides structural support to the sacrificial portion. In some embodiments, the structural support can prevent the bending of the ablation tip into a hook. In some embodiments, the structural support can cause the power pin to bend in the body of the power pin instead of the ablation tip. When the power pin bends in the body of the pin, the power pin will no longer align with the receiving contacts of the female connector and prevent insertion of the damaged male connector. The damaged male connector can then be identified and repaired prior to insertion.

In some embodiments, a female connector according to the present disclosure includes one or more retention mechanisms to limit and/or prevent the unintended removal of a connector body when a hook is inserted into the female connector. For example, the connector body can include a skirt positioned at an edge and projecting laterally from the edge. The skirt may provide one or more forward-facing contact surfaces that contacts and applies a force to an inner surface of the PDU housing. The PDU housing can then support the connector body against the pulling force caused by the hook upon a technician removing the connected electronic device.

In some embodiments, a server rack, storage rack, power supply unit (PSU) rack, or other rack of electronic devices includes a PDU mounted to a frame of the rack. The PDU includes a plurality of female connectors that align with shelves, rails, or other support mechanisms of the rack that support electronic devices in the rack. In some embodiments, the PDU includes 10, 20, 30, 40, or more female connectors. In some embodiments, all of the female connectors may be connected to electronic devices or less than all of the female connectors may be connected to electronic devices.

In some embodiments, the female connectors provide electrical power to the electronic devices. The female connectors may also provide data communication to the electronic devices. For example, a female connector may have a plurality of receiving contacts configured to receive power pins from a male connector and a plurality of data contacts that are configured to receive data pins from the male connector. In some embodiments, the receiving contacts of the female connector provide at least 10 A of electrical current. In some embodiments, the receiving contacts of the female connector provide at least 20 A of electrical current. In some embodiments, the receiving contacts of the female connector provide at least 30 A of electrical current. In some embodiments, the receiving contacts of the female connector provide at least 120 V of electrical potential. In some embodiments, the receiving contacts of the female connector provide at 240 V of electrical potential. In some embodiments, the receiving contacts of the female connector provide at 400 V of electrical potential.

The receiving contacts of the female connector are protected by and spaced apart by a connector body. The connector body has a plurality of ports positioned therein, and each receiving contact of the plurality of receiving contacts is located in a port, respectively. The receiving contacts are insulated from one another by the insulating material of the connector body. In some embodiments, the connector body is plastic, such as nylon. The connector body provides protection from electrical shorts that may cause fires or other damage, and the connector body provides protection from dangerous electrical shocks to a user.

The connector body is positioned in an opening of the PDU housing. Some connector bodies for female connectors are positioned in the opening of the PDU housing by a press fit or friction fit. The connector body can be pulled from the opening and away from the housing by a force that overcomes the friction between the connector body and the housing. In some embodiments according to the present disclosure, a connector body has one or more retention mechanisms that limit or prevent the movement of the connector body away from the housing.

A male connector may connect to the female connector. A conventional male connector has a plurality of power pins protruding therefrom that have sacrificial ablative tips. The ablative tips are tabs that protrude from a terminal end of the power pin. The ablative tip is positioned in the transverse center of the terminal end to receive arcing from a receiving contact. The tab-like ablative tip, however, is prone to damage upon impacts. An impact that applies a lateral force to the ablative tip can bend the ablative tip to the side.

In some examples, a damaged ablative tip can be further damaged by inserting the damaged ablative tip into a female connector, such as described herein. The resulting damaged ablative tip can form a hook that can engage with and pull off the friction-fit connected connector body. As described, in some embodiments, a skirt on the connector body can limit or prevent the removal the of the connector body, and, in some embodiments, support material on the ablative tip can prevent the formation of a hook.

In some embodiments, a connector body according to the present disclosure has a plurality of ports positioned in and through the connector body. Each of the ports extends through the connector body from a front surface to a back surface. Each port has a receiving contact positioned therein to physically contact and create an electrical connection with a power pin of the male connector.

In some embodiments, a hooked ablative tip or otherwise damaged ablative tip can be inserted into the port and engage with a sidewall of the port or engage with the back surface of the connector body. Pulling on the male connector can then apply a pulling force to the connector body. As the connector body is conventionally formed of plastic or another elastically deformable material, pulling on the connector body can bow the connector body, releasing the connector body from contact with the lateral sides of the opening in the PDU housing and reducing or removing the friction force holding the connector body in place. In other examples, the connector body is formed of a rigid material, and the pulling force overcomes the friction force holding the connector body in place, exposing the contacts behind the connector body.

A connector body according to the present disclosure has, in some embodiments, at least one forward-facing contact surface that is positioned on a perimeter edge of the connector body and is outside the opening. The contact surface, therefore, applies a compressive force to an inner surface of the PDU housing and resists outward movement and/or pull-out of the connector body.

In some embodiments, the skirt is positioned on a portion of the perimeter edge of the connector body. In some embodiments, the skirt is positioned on the lateral ends of the connector body. As the connector bodies are stacked in the PDU housing, adding the skirts to the lateral ends of the connector body may allow embodiments of a connector body according to the present disclosure to be used with existing standardized PDU housings.

The skirt may be positioned along a top edge and/or a bottom edge of the connector body. As some embodiments of a connector body are prone to deformation (e.g., bowing), forward-facing contact surfaces on the top and bottom of the connector body, where the contact surfaces are closer together, may allow for less deformation under a pulling force on the connector body. In at least one embodiment, the connector body has a skirt that is located around the entire perimeter edge of the connector body, such that a forward-facing contact surface contacts the inner surface of the PDU housing around the entire edge of the opening in the PDU housing.

In some embodiments, the skirt can allow for additional retention mechanisms to be applied to and/or between the connector body and the PDU housing. For example, the contact surface of the connector body provides a compression surface for the application of an adhesive that can supplement the retention of the connector body in the opening. In other examples, the skirt can provide space for a mechanical fastener to fasten the connector body to the PDU housing. Mechanical fasteners can include clips, clamps, pins, screws, bolts, nuts, rods, rivets, or other fasteners that apply a compression force to hold the components together.

In some embodiments, the amount and/or likelihood of a pulling force being applied to the connector body can be reduced by using embodiments of a male connector according to the present disclosure. In some embodiments, the male connector includes at least one power pin. The power pin is configured to insert into the port of a connector body and connect with a receiving contact. Due the chances of arcing, a power pin according to the present disclosure includes an ablative tip with a terminal edge that is positioned longitudinally protruding from a body of the power pin.

The ablative tip according to the present disclosure has a greater horizontal strength to resist lateral bending, relative to a conventional ablative tip of the same material. In some embodiments, the ablative tip has a greater lateral bending strength than a portion of the body of the power pin, resulting in the body of the power pin bending in response to an applied lateral force. The bent body of the power pin will not allow insertion of the damaged connector and can prevent a dangerous or damaging situation.

A power pin according to the present disclosure includes a body oriented along a longitudinal axis with an ablative tip at a terminal end of the body. The ablative tip has a terminal edge at or near a vertical center of the ablative tip with support material on at least one vertical side (e.g., above and/or below) the terminal edge.

In some embodiments, the ablative tip has a terminal edge that is perpendicular to the longitudinal axis. The terminal edge may be positioned proximate the vertical center of the terminal end and have a tip height that is a percentage of the pin height of the power pin. In some embodiments, the tip height is a percentage of the pin height in a range having an upper value, a lower value, or upper and lower values including any of 20%, 30%, 40%, 50%, 60%, 70%, 75%, or any values therebetween. In some examples, the tip height is greater than 20% of the pin height. In some examples, the tip height is less than 75% of the pin height. In other examples, the tip height is between 20% and 75% of the pin height. In yet other examples, the tip height is between 30% and 50% of the pin height. In at least one example, the tip height is about 33% of the pin height.

In some embodiments, the support material is symmetrical on either side of the terminal edge. In other embodiments, the support material is asymmetrical. In some embodiments, the support material spans the height of the pin between the terminal edge and the top and bottom edges of the pin body. For example, when the tip height is 33% of the pin height, the support material may be positioned in the 33% of the pin height above the terminal edge and in the 33% of the pin height below the terminal edge. In some embodiments, when the tip height is 33% of the pin height, the support material may be positioned in 17% of the pin height above the terminal edge and in the 50% of the pin height below the terminal edge.

The ablative tip may have varying lengths in the longitudinal direction of the power pin relative to the pin height. In some embodiments, the tip length is a percentage of the pin height in a range having an upper value, a lower value, or upper and lower values including any of 20%, 30%, 40%, 50%, 60%, 70%, 75%, or any values therebetween. In some examples, the tip length is greater than 20% of the pin height. In some examples, the tip length is less than 75% of the pin height. In other examples, the tip length is between 20% and 75% of the pin height. In yet other examples, the tip length is between 30% and 50% of the pin height. In at least one example, the tip length is about 33% of the pin height.

In some embodiments, the support material does not connect between the terminal edge and the top and/or bottom edge of the pin body. For example, a terminal edge may have a tip height that is 33% of the pin height, while the support material above the terminal edge may have a first support height that is 15% of the pin height and the support material below the terminal edge may have a second support height that is 15% of the pin height. The support material may sufficiently support the ablative tip while leaving a shoulder on the pin body.

Some embodiments of an ablative tip include a curved portion or any entirely curved ablative tip. In some examples, the ablative tip has a continuously curving terminal end in longitudinal cross-section. In some examples, the ablative tip has a constant radius of curvature. For example, the radius of curvature is unchanging around the arc length of the curved portion of the ablative tip. In other examples, the ablative tip has an exponential radius of curvature, such as a parabolic curvature or hyperbolic curvature. In some embodiments, the curved terminal end of the power pin that forms the ablative tip spans the pin height from the top edge of the power pin to the bottom edge of the power pin. In some embodiments, the curved terminal end has a height that is less than the pin height. In at least one embodiment, the terminal edge is curved with angled support material above and/or below the curved terminal edge. In other embodiments, the terminal edge is perpendicular to the longitudinal axis with curved support material above and/or below the straight terminal edge.

In at least some embodiments according to the present disclosure, a stronger ablative tip can resist bending and forming a hook that can damage a female connector. In at least some embodiments according to the present disclosure, a female connector includes a connector body with a skirt to provide a contact surface with a PDU housing, which limits or prevents the connector body from being pulled from the PDU housing. In at least one embodiment, a system includes both an ablative tip with support material in a male connector and a connector body with a skirt in a female connector to reduce the risk of exposure of high-power contacts.

The present disclosure relates to systems and methods for providing a connection for transmitting electrical power according to at least the examples provided in the sections below:

1. An electrical connector for transmitting electrical power, the connector comprising:
    at least one power pin having a body oriented in a direction of a longitudinal axis and an ablative tip at a terminal end along the longitudinal axis,
        wherein the ablative tip includes:
            a terminal edge, and
            a support material positioned on a transverse side of the terminal edge that provides structural support to the terminal edge.
2. The connector of section 1, wherein the support material is positioned adjacent to a first longitudinal edge of the power pin and adjacent to the terminal edge and is continuous therebetween.
3. The connector of section 2, wherein the support material is positioned adjacent to a first longitudinal edge of the power pin and adjacent to the terminal edge and is continuous therebetween.
4. The connector of any preceding section, wherein the connector includes at least 6 power pins with ablative tips.
5. The connector of any preceding section, wherein the ablative tip is trapezoidal in longitudinal cross-section.
6. The connector of any preceding section, wherein the ablative tip is curved in longitudinal cross-section.
7. The connector of section 6, wherein the ablative tip has a constant radius of curvature in longitudinal cross-section.
8. The connector of any preceding section, wherein the terminal edge is perpendicular to the longitudinal direction.
9. The connector of any preceding section, wherein the terminal edge is less than ⅓ of a height of the ablative tip and the support material accounts for the remaining height of the ablative tip.
10. The connector of any preceding section, wherein the ablative tip has a greater lateral bending strength than a portion of the body.
11. The connector of any preceding section, wherein the male connector is part of a blade server.
12. An electrical connector for transmitting electrical power, the connector comprising:
    a plurality of receiving contacts configured to provide electrical power to complementary power pins; and
    an electrically insulating connector body including:
    a connector body,
    a plurality of ports positioned in the connector body from a front surface of the connector body to a back surface of the connector body, wherein the plurality of ports included receiving contacts, and
    a skirt positioned proximate the back surface of the connector body and projecting laterally from the connector body, the skirt having a forward-facing contact surface that projects laterally beyond the body of the connector body.
13. The electrical connector of section 12, further comprising a device housing with an opening therein and the connector body positioned in the opening.
14. The electrical connector of section 13, wherein the contact surface of the skirt contacts an inner surface of the housing.
15. The electrical connector of section 13, wherein the housing is a power distribution unit housing.
16. The electrical connector of any of sections 12-15, wherein the skirt is positioned around an entire perimeter of the back surface.
17. An electrical connector system for transmitting electrical power, the system comprising:
a male connector including:
    a plurality of power pins having a body oriented in a direction of a longitudinal axis and an ablative tip at a terminal end along the longitudinal axis, wherein the ablative tip includes:
    a terminal edge, and
    a support material positioned on a transverse side of the terminal edge that provides structural support to the terminal edge; and
a female connector including:
    a plurality of receiving contacts configured to provide electrical power to the plurality of power pins; and
    an electrically insulating connector body including:
    a connector body,
    a plurality of ports positioned in the connector body from a front surface of the connector body to a back surface of the connector body, wherein the plurality of ports included receiving contacts receiving contacts, and a skirt positioned proximate the back surface of the connector body and projecting laterally from the connector body, the skirt having a forward-facing contact surface that projects laterally beyond the body of the connector body.

18. The system of section 17, wherein the female connector is configured to provide at least 30 amperes of electrical current to the male connector.

19. The system of section 17 or 18, wherein the female connector is configured to provide at least 400 volts of electrical potential to the male connector.

20. The system of any of sections 17-19, wherein the female connector is part of a server rack and the male connector is part of a blade server.

21. Any device, system, or method described or depicted herein.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the scope of the present disclosure, and that various changes, substitutions, and alterations may be made to embodiments disclosed herein without departing from the scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. An electrical connector for transmitting electrical power, the connector comprising:
   at least one power pin having a body oriented in a direction of a longitudinal axis and including a body material, and an ablative tip extending from a terminal end of the body along the longitudinal axis to a terminal end of the ablative tip, wherein the ablative tip is wider at the terminal end of the body than at the terminal end of the ablative tip and includes:
      an ablative tip region integrally formed at the terminal end of the body and extending to the terminal end of the ablative tip, the ablative tip region including the body material; and
      first and second structural support regions positioned on opposite sides of the ablative tip region and providing structural support to limit bending of the ablative tip region and when the ablative tip is under pressure to cause a substantial bending of the body at a rear support face to prevent improper use of the power pin, wherein side edges of the first and second structural support regions connect to shoulders formed on the terminal end of the body.

2. The electrical connector of claim 1, wherein the connector includes at least 6 power pins with ablative tips.

3. The electrical connector of claim 1, wherein the ablative tip is trapezoidal in longitudinal cross-section.

4. The electrical connector of claim 1, wherein a terminal edge is perpendicular to a longitudinal direction.

5. The electrical connector of claim 1, wherein a terminal edge has a tip height less than ⅓ of a pin height of the power pin and the structural support regions are positioned between the terminal edge and a top edge of the power pin and a bottom edge of the power pin.

6. The electrical connector of claim 1, wherein the ablative tip has a greater lateral bending strength than a portion of the body.

7. The electrical connector of claim 1, wherein a male version of the electrical connector is part of a blade server.

8. The electrical connector of claim 1, wherein a tip height of a terminal edge is less than 33% of a pin height.

9. The electrical connector of claim 1, wherein a terminal edge has a tip height that is 33% of a pin height, and wherein the first structural support region has a first support height that is 15% of the pin height.

10. The electrical connector of claim 9, wherein the second structural support region has a second support height that is 15% of the pin height.

11. The electrical connector of claim 1, wherein at least one of the first structural support region and the second structural support region has a material that is different from the body material.

12. An electrical connector system for transmitting electrical power, the system comprising:
   a male connector including:
      a plurality of power pins each having a body oriented in a direction of a longitudinal axis and an ablative tip extending from a terminal end of the body along the longitudinal axis to a terminal end of the ablative tip, wherein the ablative tip is wider at the terminal end of the body than at the terminal end of the ablative tip and includes:
a body including a body material,
an ablative tip region integrally formed at the terminal end of the body and extending to the terminal end of the ablative tip, the ablative tip region including the body material; and
first and second structural support regions positioned on opposite sides of the ablative tip region and providing structural support to limit bending of the ablative tip region and when the ablative tip is under pressure to cause a substantial bending of the body at a rear support face to prevent improper use of the power pin, wherein side edges of the first and second structural support regions connect to shoulders formed on the terminal end of the body; and a female connector including:
a plurality of receiving contacts configured to provide electrical power to the plurality of power pins; and
an electrically insulating connector body including:
a connector body,
a plurality of ports positioned in the connector body from a front surface of the connector body to a back surface of the connector body, wherein the plurality of ports include receiving contacts, and
a continuously unbroken skirt positioned proximate the back surface of the connector body and projecting laterally from the connector body, the skirt having a forward-facing contact surface that projects laterally beyond the body of the connector body.

13. The system of claim 12, wherein the female connector is configured to provide at least 30 amperes of electrical current to the male connector.

14. The system of claim 12, wherein the female connector is configured to provide at least 400 volts of electrical potential to the male connector.

15. The system of claim 12, wherein the female connector is part of a server rack and the male connector is part of a blade server.

16. The electrical connector of claim 12, wherein at least one of the first structural support region and the second structural support region has a material that is different from the body material.

17. An electrical connector for transmitting electrical power, the connector comprising:
at least one power pin having a body oriented in a direction of a longitudinal axis and including a body material, and an ablative tip at a terminal end of the body along the longitudinal axis, wherein the ablative tip includes:
a terminal edge including the body material,
a first support material positioned on a first transverse side of the terminal edge and the first support material is different from a body material, and
a second support material positioned on a second transverse side of the terminal edge and the second support material is different from the body material.

* * * * *